United States Patent [19]

Entine et al.

[11] 3,721,938

[45] March 20, 1973

[54] CADMIUM TELLURIDE DEVICES WITH NON-DIFFUSING CONTACTS

[75] Inventors: Gerald Entine, Newton; Franklin H. Cocks, Waltham; Carl Rice Mitchell, Watertown, all of Mass.

[73] Assignee: Tyco Laboratories Incorporated, Waltham, Mass.

[22] Filed: Dec. 23, 1971

[21] Appl. No.: 211,723

[52] U.S. Cl. ..............338/15, 250/200, 252/62.3 ZT, 252/501

[51] Int. Cl. ..............................................H01c 7/08

[58] Field of Search......338/15; 317/235 VA, 235 N; 250/200; 252/501, 62.3 ZT; 148/33; 96/88

[56] References Cited

UNITED STATES PATENTS

| | | | |
|---|---|---|---|
| 2,866,878 | 12/1958 | Briggs et al. | 338/15 X |
| 2,965,867 | 12/1960 | Greig | 338/15 |

*Primary Examiner*—C. L. Albritton
*Attorney*—Robert J. Schiller et al.

[57] ABSTRACT

A method of providing non-diffusing contacts for cadmium telluride semiconductor devices, notably photodetectors. The contacts consist of iridium applied by sputtering and are low resistance, but also photosensitive at 400°C.

6 Claims, No Drawings

CADMIUM TELLURIDE DEVICES WITH NON-DIFFUSING CONTACTS

This invention relates to cadmium telluride semiconductor devices and more particularly to provision of stable electrical contacts for cadmium telluride semiconductor devices.

Cadmium telluride is recognized as having utility in producing high temperature semiconductor devices such as photodetectors and transistors and substantial research effort has been expended in developing cadmium telluride photoconductor and photovoltaic devices for use at temperatures in the range of about 200°–500°C. By way of example, cadmium telluride is desirable as the sensitive element of an aircraft engine fire detector operable at 400°C because of its relatively high resistivity and convenient spectral sensitivity. It has been determined that an optimal detector for the flame of burning jet fuel superimposed on a background of about 1,000°F would be insensitive to radiation above 1.2$\mu$ and be most sensitive to radiation between 0.75 and 1.0$\mu$. Cadmium telluride, with a bandgap of 1.44 eV (0.85$\mu$) at room temperature and of 1.25 eV (1$\mu$) at 400°C, provides the ideal spectral sensitivity.

However, semiconductor devices require stable non-diffusing contacts and this requirement has presented an obstacle to development of cadmium telluride semiconductor devices for use in high temperature applications.

Although prior to this invention some success has been reported with respect to making ohmic contacts for CdTe, the prior art technology is the result of studies of CdTe with carrier concentrations that are unacceptably high for photoconductors for fire detector applications. For the latter purposes it has been determined that the carrier concentration should be below 5 × $10^{14}/cm^3$. When applied to high purity CdTe, i.e., CdTe with a carrier concentration below 5 × $10^{14}/cm^3$. When applied to high purity CdTe, i.e., CdTe with a carrier concentration below 5 × $10^{14}/cm^3$, prior art techniques produce contacts that generally are rectifying at room temperature and become more nearly ohmic at higher temperatures, but which are not suitable since they are not stable and tend to diffuse readily into the CdTe crystal, with a consequent change in the electronic and optical transmittance qualities of the device. Typifying prior art contact fabrication techniques are those employing silver, gold and platinum as the contact materials. Contacts made of these materials all tend to diffuse into the crystal. Silver, for example, will start to diffuse into the CdTe within 15–20 minutes after being heated to about 400°C. Gold and platinum diffuse in at similar rates, e.g. diffusion of gold is detectable within 15 minutes at 550°C.

Accordingly, the primary object of this invention is to provide contacts for CdTe semiconductor devices which overcome the contact diffusion problems of the prior art.

Another object is to provide a CdTe semiconductor device having contacts that are stable and do not diffuse into the bulk crystal at temperatures below about 550°C.

Still another object is to provide a new method of making electrical contacts for CdTe semiconductor devices.

Another object is to make a photodetector that has maximum sensitivity to radiation between 0.75 and 1.0 $\mu$ and is operable at high temperatures as high as 400°C.

A further object is to provide a method of making a CdTe surface barrier detector.

Described briefly, the invention whereby the foregoing objects are achieved comprises forming contacts made of iridium. The contacts are formed by sputtering and the contact supporting portions of the CdTe crystal may or may not be subjected to etching prior to application of the contact material.

Other features and many of the attendant advantages of this invention are set forth in or rendered obvious by the following detailed description.

As noted above, silver, gold and platinum are not suitable contact materials since they diffuse readily into a CdTe crystal. Experiments with aluminum have demonstrated that it too diffuses; in fact, the rate of diffusion of aluminum is so great that a thin (500 angstrom) film of that material almost disappears from the surface of the CdTe body after 120 minutes of heating at 400°C. Other metals such as Se, Te, Pb, Bi, Po, Tl, In, Sn, Na, Li, K, Rb and Cs also are unsuitable as contact materials because of their low melting points. Group IIA elements — notably, Be, Mg, Ca, Sr and Ba — are unsuitable contact materials because they oxidize rapidly at temperatures approaching 400°C. Copper also diffuses readily into CdTe.

Gross diffusion of contact materials into cadmium telluride can be seen by viewing contact specimens with an infrared image converter. A preferred method of doing this is to apply selected contact materials to samples of a CdTe crystal that are about 2 mm. thick, place the samples in an evacuated oven, and hold them at a temperature of 400°C. The samples are then removed from the oven and viewed with an infrared image detector. Diffusion is evidenced by a darkening of the crystal and a decrease in infrared transmission. The diffusion coefficients of contact metals in CdTe increase as a function of temperature. It has been determined that the upper limit of an acceptable diffusion rate at 400°C is less than $10^{-13}cm^2/sec$. This upper limit is exceeded by copper, gold, platinum and silver. On the other hand, the diffusion rate of iridium is well below the aforesaid upper limit.

According to the present invention stable, substantially non-diffusing contacts for a cadmium telluride device are made by depositing iridium metal onto selected areas of the device in direct contact with CdTe. As is well known, electrical contacts, particularly when in the form of thin films, can be applied to semiconductor devices by various techniques such as electroplating, electroless plating, evaporation and sputtering. However, it has been determined that d.c. sputtering is a preferred practical way of depositing iridium contacts on CdTe devices.

According to this invention, the preferred method of forming iridium contacts on CdTe involves as a first step the preparation of the surface of the crystal body. This preparation may be entirely mechanical or it may include etch polishing. However, etching is avoided where a surface barrier contact is desired. The mechanical preparation not only serves to provide a flat surface to which the contacts are to be applied but also removes surface oxides. The latter is important since surface oxides inhibit production of satisfactory contacts. The mechanical surface preparation may consist of mechanical lapping or mechanical lapping followed by alumina polishing. If the preparation includes etch polishing, it may be accomplished with an e-type etch solution which consists of 10 milliliters of $HNO_3$, 20 milliliters of water and 4 grams of $K_2CR_2O_7$. Other etch solutions known to persons skilled in the art also may be used.

After the surfaces have been prepared, the specimen is placed in the sealed chamber of a sputtering unit and is masked as required so as to leave exposed only those surface areas that are to receive contacts. The preferred mode of depositing the contact material on the specimen is to use a 10 mil foil of iridium as the source material on the sputtering unit's target, evacuate the chamber and fill it with argon to a pressure of 10–15 microns, and then energize the unit with 2,000 volts d.c. (the target being negative with respect to the specimen which is at ground potential). The unit is kept energized until iridium has deposited on the specimen to a desired thickness. Usually the sputtering is continued for thirty minutes which gives an iridium film thickness of about 2,000 Angstroms. Thicker or thinner iridium layers could be formed by sputtering for longer or shorter times, respectively.

There is a significant difference between photodetectors having iridium contacts made with the etching step and those having contacts made without the etching step. Etching has the effect of rendering the contact more conductive, with the result that this contact has a relatively lower resistance at about 400°C but is still both rectifying and photosensitive at temperature of about 200°C, and even more so at room temperature. Such contacts are highly resistant to diffusion and photoconductors having same have been found to operate continuously for up to 10 hours at 400°C without any degradation of output signal due to contact diffusion but eventually degrade due to causes attributed to etchant contaminants.

If the iridium contacts are made without etching the CdTe, significant changes result. First of all, there is a dramatic increase in photodetector lifetime. CdTe photodetectors with iridium contacts made without the etching step have been found to operate continuously for as long as 130 hours at 400°C without any degradation of signal output. Another difference is an improvement in signal to noise ratio at comparable operating temperatures. A third difference is an increase in contact photoactivity, the device being essentially a contact barrier photodetector with the contacts being both rectifying and photosensitive at room temperature, i.e., 70°F, and becoming much less rectifying with increasing temperature. At 400°C the contact shows little rectification but may have greater resistance than one made with the etching step. With respect to output signal, the effect of contact photoactivity more than compensates for any increase in resistance if the entire device, i.e., the contacts as well as the CdTe crystal, is illuminated.

The reason for the marked increase in the lifetime of the detector is not known exactly since it appears that, with and without the etching step, the iridium contacts exhibit no tendency to diffuse into the CdTe crystal at temperatures up to about 550°C. However, it is thought to result from impurity contaminants left by the etching step.

Accordingly, etching may be resorted to where the lifetime of the device is not as critical as having an essentially ohmic contact at elevated temperatures or where it is desired to enhance the photoconductive property of CdTe. Similarly, etching is avoided where it is desired to increase the lifetime of the device at elevated temperatures or to increase the photoactivity of the contacts.

It is to be noted also that the invention makes possible stable non-diffusing contacts on both P- and N-type CdTe and on CdTe having a carrier concentration greater or less than $5 \times 10^{14}/cm^3$.

The invention also makes it possible to make stable non-diffusing contacts for other CdTe semiconductor devices such as transistors and is applicable to both "thick" and "thin" photodetectors. By way of example, a photodetector is deemed to be thick if it has a thickness in the order of about 3mm. and to be thin if it has a thickness in the order of 0.5 mm. The low diffusion rate of the contacts makes them particularly useful for thin film CdTe devices. The photoconducting mode of CdTe is suppressed by an increase in thickness, with the result that a thick CdTe photodetector with contacts made according to this invention tends to have its photosensitivity confined to its contacts with little or no photoconductivity being exhibited by the CdTe crystal. In a thin detector, the photoconductivity mode is enhanced as evidenced by the fact that illuminating the crystal but not the contacts will produce a signal, and an increase in signal results if both contacts and crystal are illuminated.

With the present invention iridium contacts may be applied in various thicknesses and to selected areas of the crystal, e.g., to end or side surfaces.

Following is a specific example of how to practice this invention to produce a contact barrier device useful as a flame detector.

In this case a CdTe crystal, in the form of a rectangular block measuring 3 mm. thick, 0.5 cm. wide and 1 cm. long, was prepared by mechanically lapping and then alumina polishing its surfaces. Then, with all but its opposite end surfaces masked by aluminum foil, the block was placed in a sputtering unit and iridium contacts with a thickness of about 2,500 Angstroms were sputtered onto its exposed end surfaces according to the sputtering procedure described above. Thereafter the crystal was mounted on a flat ceramic base with the iridium contacts engaged by a pair of metallic spring members that served as electrical terminals as well as acting to hold the crystal to the base. The device was then tested to determine its photodetective behavior. This was accomplished by connecting it in series with a regulated 12 volt d.c. power supply and a decade box load resistor and illuminating it at a temperature of 400°C with light of 800–900m$\mu$ wave-length at an intensity of approximately 100mW/cm$^2$. The output signal was taken across the terminals connected to the iridium contacts and measured. The contact barrier photodetector produced a 42$\mu$V signal with a signal to noise ratio of about 14 to 1 and an output impedance of 300 ohms. The detector was operated for over 100 hours with no sign of signal degradation.

It is to be understood that the thickness of the iridium contact may be varied and that it may be greater or less than 2,000 Angstroms thick, as desired. Furthermore, the sputtering procedure need not be exactly as herein described and may be varied in ways obvious to persons skilled in the art, e.g., the pressure in the sputtering chamber and the voltage applied to the sputtering unit may be greater or less than hereinabove specified (so long as such changes are not so great as to prevent sputtering and deposition of the iridium).

Still other changes may be made in practicing the invention. Thus the number of contacts, the area of the contacts, and the mode of making terminal connections to the contacts may be varied as required. Thus terminal connections may be made by depositing gold or silver films on the iridium contacts and attaching wire leads to such films by state of the art techniques such as welding, soldering or a conductive cement.

It is to be understood that the conclusion presented hereinabove that the iridium contacts are photosensitive is not intended to denote that the contacts per se rather than their interfaces with the CdTe crystal are photosensitive. It is not known for certain that this is so; on the contrary, it appears that the interfaces are also photosensitive in view of their detected rectifying properties. Thus when it is stated in this specification or the appended claims that the contacts are photosensitive, it is to be understood that the contacts per se and/or their interfaces with the crystal are photosensitive. In this connection it is to be understood that the photosensitivity of the contact-crystal interfaces is less pronounced, for example, where the contacts are on the end faces of an elongate CdTe crystal of rectangular or square cross-section and the incident light rays are directed at the end faces and normal to the planes of the contact-crystal junctions, and more pronounced when the light rays are directed parallel to the end faces and impinge directly on said junctions.

What is claimed is:

1. A semiconductor device comprising a cadmium telluride crystal having an electrical contact thereof of iridium.

2. A device according to claim 1 wherein said contact comprises a film having a thickness in the order of 2,000 Angstroms or more.

3. A semiconductor device according to claim 1 where said contact is photosensitive.

4. A semiconductor device according to claim 1 wherein said crystal has two contacts made of iridium located at spaced portions of said crystal.

5. A semiconductor device according to claim 4 wherein said device is a photodetector.

6. A method of providing an electrical contact for a cadmium telluride crystal comprising attaching iridium onto said crystal.

* * * * *